United States Patent
Lagally et al.

(10) Patent No.: US 9,181,092 B2
(45) Date of Patent: Nov. 10, 2015

(54) SEMICONDUCTOR NANOWIRE THERMOELECTRIC MATERIALS AND DEVICES, AND PROCESSES FOR PRODUCING SAME

(71) Applicant: Wisconsin Alumni Research Foundation, Madison, WI (US)

(72) Inventors: Max G. Lagally, Madison, WI (US); Paul G. Evans, Madison, WI (US); Clark S. Ritz, Middleton, WI (US)

(73) Assignee: WISCONSIN ALUMNI RESEARCH FOUNDATION, Madison, WI (US)

( * ) Notice: Subject to any disclaimer, the term of this patent is extended or adjusted under 35 U.S.C. 154(b) by 210 days.

(21) Appl. No.: 13/945,171

(22) Filed: Jul. 18, 2013

(65) Prior Publication Data
US 2014/0024202 A1   Jan. 23, 2014

Related U.S. Application Data

(60) Division of application No. 12/986,277, filed on Jan. 7, 2011, now Pat. No. 8,536,440, which is a continuation of application No. 11/745,156, filed on May 7, 2007, now Pat. No. 7,888,583.

(51) Int. Cl.

| | | |
|---|---|---|
| H01L 21/20 | (2006.01) | |
| H01L 21/36 | (2006.01) | |
| C23C 16/54 | (2006.01) | |
| H01L 35/14 | (2006.01) | |
| B82Y 40/00 | (2011.01) | |
| B82Y 30/00 | (2011.01) | |
| H01L 29/06 | (2006.01) | |
| H01L 29/12 | (2006.01) | |
| H01L 35/22 | (2006.01) | |
| H01L 35/32 | (2006.01) | |
| H01L 35/34 | (2006.01) | |
| B82Y 10/00 | (2011.01) | |
| H01L 35/26 | (2006.01) | |

(52) U.S. Cl.
CPC ............... B82Y 40/00 (2013.01); B82Y 30/00 (2013.01); H01L 29/0665 (2013.01); H01L 29/0673 (2013.01); H01L 29/127 (2013.01); H01L 35/22 (2013.01); H01L 35/32 (2013.01); H01L 35/34 (2013.01); B82Y 10/00 (2013.01); H01L 35/26 (2013.01); Y10S 977/70 (2013.01)

(58) Field of Classification Search
CPC ........ B82Y 10/00; B82Y 30/00; B82Y 40/00; B82Y 99/00; H01L 35/22; H01L 35/34; Y10S 977/70
USPC ........... 136/239; 438/478, 484; 977/762, 774, 977/855, 856
See application file for complete search history.

(56) References Cited

U.S. PATENT DOCUMENTS

| | | | |
|---|---|---|---|
| 6,294,450 B1 * | 9/2001 | Chen et al. | ..... 438/597 |
| 2005/0145596 A1 * | 7/2005 | Metz et al. | ..... 216/13 |
| 2005/0250276 A1 * | 11/2005 | Heath et al. | ..... 438/200 |

* cited by examiner

*Primary Examiner* — Jonathan Johnson
*Assistant Examiner* — Lindsey Bernier
(74) *Attorney, Agent, or Firm* — Bell & Manning LLC

(57) ABSTRACT

The present invention provides nanowires and nanoribbons that are well suited for use in thermoelectric applications. The nanowires and nanoribbons are characterized by a periodic compositional longitudinal modulation. The nanowires are constructed using lithographic techniques from thin semiconductor membranes, or "nanomembranes."

20 Claims, 6 Drawing Sheets

SEMICONDUCTOR NANOWIRE THERMOELECTRIC MATERIALS AND DEVICES, AND PROCESSES FOR PRODUCING SAME

CROSS-REFERENCE TO RELATED PATENT APPLICATIONS

This application is a divisional of U.S. patent application Ser. No. 12/986,277 filed Jan. 7, 2011, which is a continuation of U.S. patent application Ser. No. 11/745,156 filed May 7, 2007, the entire disclosure of which is incorporated herein by reference in its entirety.

STATEMENT OF GOVERNMENT RIGHTS

This invention was made with government support under DE-FG02-03ER46028 awarded by the US Department of Energy. The government has certain rights in the invention.

FIELD OF THE INVENTION

The present invention relates generally to the field of semiconductor nanowire and nanoribbon-based thermoelectric materials and structures and devices made therefrom.

BACKGROUND OF THE INVENTION

Thermoelectric (TE) materials derive electrical power from a thermal gradient or create a thermal gradient from an applied electrical potential difference. They can thus serve to turn heat into electrical power or to transfer heat by applying a voltage. The first property is useful in waste heat recovery or in solar-energy conversion. In the conversion of heat energy to electrical power, in particular, TE materials offer unique advantages, including the ability to utilize the entire solar spectrum, no moving parts, and negligible cost of operation. The widespread deployment of thermoelectric systems, however, demands performance that cannot be achieved by either bulk materials or present paradigms for optimizing nanomaterials. The second property, transferring heat by applying a voltage, is the basis of TE heat pumps. These devices are useful in refrigeration and in the cooling of electronic devices. Cooling with higher efficiencies than are available presently would be valuable in cooling hot spots in integrated circuits. Advances towards higher cooling capability depend on the development of improved TE materials. Significant improvements to both heat conversion and heat removal require the development of novel functional TE materials and device structures.

The essential figure of merit for thermoelectrics, ZT, has remained near 1 in commercial materials for 40 years. Structures based on circuits using semiconductor nanostructures have exhibited values of ZT of 2 or more, and theoretical work has predicted even higher values, which have yet to be realized. Nanowires represent a tantalizing opportunity for improving thermoelectrics. Unfortunately, critical bottlenecks in applying these emerging materials have arisen in realizing circuits incorporating more than a few wires and in developing wire-based nanostructures that exhibit optimum thermoelectric properties. The growth or fabrication of structures modulated in composition is particularly challenging, but is very important if high ZT values are to be realized. The integration bottlenecks have arisen in part because conventional nanowire production has remained essentially unchanged since the vapor-liquid-solid (VLS) studies of the 1960s. The VLS process involves fundamentally stochastic phenomena, such as nucleation and growth, that are at odds with the need to create multiple identical structures, as is the norm in the semiconductor industry. The doping levels, size, and crystallographic orientation of nanowires, and even the compositions of semiconductors, must be compatible with VLS growth and cannot be optimized independently.

Superlattice nanowires are being investigated for thermoelectric applications (see, e.g., S. Lee, et al., *Appl. Phys. Lett.* (2006)), and it is even suspected that such structures could act as a heat engine with efficiencies near the fundamental limit set by the Carnot cycle (T. E. Humphrey and H. Linke, *Phys. Rev. Lett.*, 94, 096601 (2005)). In a superlattice nanowire ("SLNW") the composition varies periodically along the length of the nanowire. Current techniques for making SLNWs involve gold-catalyzed nanowire growth (M. Law, et al., *Annual Review of Materials Research*, 2004) or templated growth with porous materials such as alumina (L. Dresselhaus, *Phys. Rev. B*, 68, 075304 (2003)). The origins of the improved thermoelectric effects in these structures are still not completely understood, and it is suspected that many processes contribute to the difference between the properties of nanoscale SLNWs and larger-area superlattices. It is known, however, that the small size of the nanowires creates lateral quantum confinement and that the compositional variation creates a miniband along the length of the nanowire, providing an SLNW with controllable electronic and thermal properties. However, many SLNWs connected in series through narrow junctions are desirable for thermoelectric applications, and such connected SLNWs are impractical, if not impossible, to fabricate using conventional nanowire growth processes.

SUMMARY OF THE INVENTION

The present invention provides nanowires and nanoribbons that are well-suited for use in thermoelectric applications. The nanowires and nanoribbons are characterized by a periodic longitudinal modulation. This periodic longitudinal modulation may be a compositional modulation or a strain-induced modulation. The nanowires and nanoribbons are constructed using lithographic techniques from thin semiconductor membranes, or "nanomembranes." By fabricating the nanowires and nanoribbons using a top-down, lithography-based approach, thousands or millions of identical nanowires or nanoribbons may be fabricated, and the composition, orientation, doping and strain characteristics of these nanoribbons may be controlled.

One aspect of the present invention provides superlattice nanowires having a longitudinal compositional modulation arising from a plurality of adjacent quantum dots disposed along the lengths of the nanowires. Neighboring quantum dots have different compositions such that a periodic compositional pattern is formed along the nanowires. For example, a superlattice nanowire comprising quantum dots of two different compositions (i.e., compositions "A" and "B") could be represented by the pattern ABABAB.

A compositional superlattice nanowire may be constructed from a semiconductor nanomembrane of a first semiconductor material by patterning a plurality of nanoscale strips in the nanomembrane and removing the first semiconductor material between the strips, thereby defining strips of the first semiconductor material separated by lateral channels. The strips are desirably patterned in a linear array wherein the strips are arranged in a parallel, or substantially parallel, alignment. The lateral channels may then be filled in with a second semiconductor material using epitaxial growth. The result is a nanomembrane of alternating strips of the first and second semiconductor materials. An array of superlattice nanowires may be fabricated from the nanomembrane by cutting (e.g., etching) an array of superlattice nanowires into the nanomembrane, wherein the longitudinal axes of the superlattice nanowires are perpendicular to or substantially perpendicular to the longitudinal axes of the alternating strips of the first and second semiconductor materials. The nanowires may then be fully or partially released from the underlying substrate by fully or partially undercutting the nanowires. In these embodiments, the first and second materials may be different materials, alloys of the same material having different compositional ratios, or materials having different doping characteristics.

Another aspect of the invention provides nanowires having a longitudinal compositional modulation defined by a plurality of nanowire segments arranged in an end-to-end configuration. (As used herein, a "nanowire segment" refers to a relatively short nanowire that makes up a segment of a larger nanowire.) In this configuration, the ends of neighboring nanowire segments having different compositions overlap to provide a plurality of junctions (e.g., pn-junctions) connected in series by the central sections of the nanowire segments (i.e., the sections of the nanowire segments between the ends, which are not in contact with other nanowire segments). For example, a compositionally modulated nanowire constructed from nanowire segments of a first material ("A") and a second material ("B") could be represented as an A-AB(junction)-B-AB(junction)-A. These compositionally modulated nanowires may have a zig-zag pattern along their length, with a junction at each turn in the zig-zag, if the ends of the nanowire segments come together at an angle other than 180°.

A compositionally modulated nanowire may be constructed from a semiconductor nanomembrane of a p-type semiconductor material by patterning a plurality of parallel or substantially parallel nanoscale strips in the nanomembrane and removing the first semiconductor material between the strips, thereby defining a plurality of strips of the first semiconductor material separated by lateral channels. The process is repeated on a second semiconductor nanomembrane of an n-type semiconductor material to provide a plurality of strips of the second semiconductor material separated by lateral channels. Membrane bonding techniques may then be used to transfer and bond the strips of p-type semiconductor material onto the strips of n-type semiconductor material, desirably at an orientation that provides an angle of less than 180° between the longitudinal axes of the strips of the p-type semiconductor material and the longitudinal axes of the strips of the n-type semiconductor material. The result is a mesh structure having an array of pn-junctions formed at the areas of overlap between the strips of p-type semiconductor material and the strips of n-type semiconductor material. Slicing the grid diagonally through rows of junctions provides a compositionally modulated nanowire including a large number of pn-junctions connected in series. This provides a material that increases phonon scattering without affecting electron transport.

Yet another aspect of the invention provides nanoribbons having longitudinal strain modulations, rather than compositional modulations. These nanoribbons are characterized by alternating regions of strain along the length of the nanoribbon. Such strained nanoribbons can be created by growing quantum dots on opposing surfaces of a semiconductor nanoribbon. The lattice mismatch between the quantum dots and the nanoribbon imparts strain to the nanoribbon, which induces the quantum dots on the opposing surfaces of the nanoribbon to self-assemble into anticorrelated patterns that produce a periodic strain modulation along the length of the nanoribbon. The strain modulation in turn induces a band structure modulation that can give rise to a miniband, collapsing the allowed energies of conducting charge carriers to an optimal narrow range. Strain modulations may also benefit ZT through increased phonon scattering. Control of the strain and the period of the modulation is obtained by control of the quantum dot composition and size, and by the thickness and composition of the nanoribbon on which the dots are grown.

Further objects, features, and advantages of the invention will be apparent from the following detailed description when taken in conjunction with the accompanying drawings.

BRIEF DESCRIPTION OF THE DRAWINGS

FIG. 4(a), lower panel, shows the strain distribution of two quantum dots at the minimum-energy (anticorrelated) configuration on a 25-nm-thick silicon membrane.

DETAILED DESCRIPTION

Figure 1:
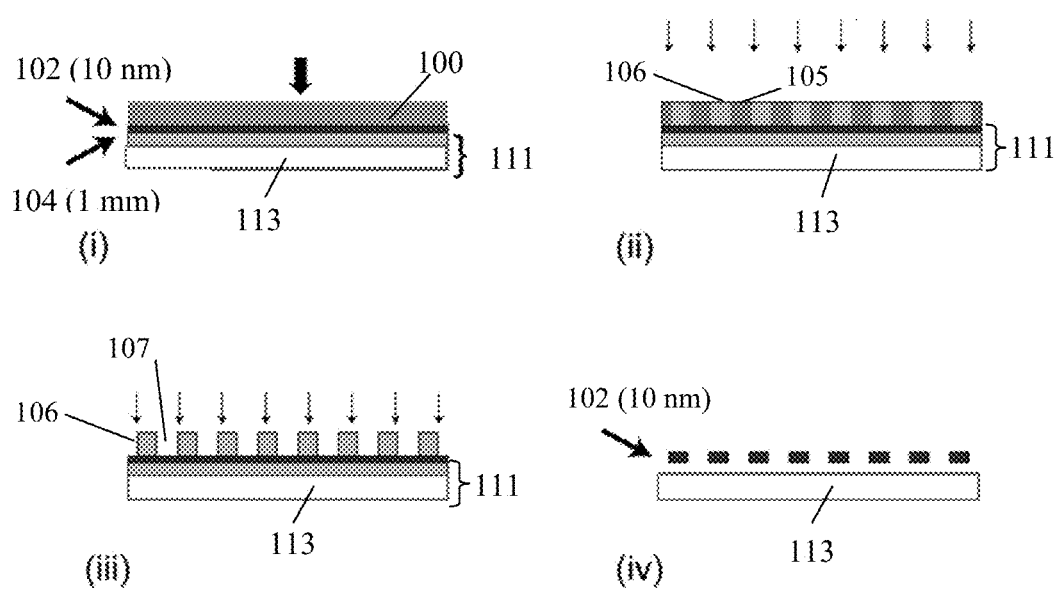
FIG. 1 shows a general process for fabricating a plurality of nanowires in a semiconductor nanomembrane. Panel (i) shows electron beam/interferometric/nanoimprint patterning (represented by a downward pointing arrow) of a PMMA resist; panel (ii) shows the development of the resist by a developer solution (represented by downward pointing arrows); panel (iii) shows the etching of an SOI device layer using wet or dry processes (wet or dry Si etchants are represented by the downward pointing arrows) and the undercutting of the wires using wet etch in HF; panel (iv) shows freestanding Si nanowires supported only at their ends.

The present invention provides nanowires and nanoribbons that are well-suited for use as thermoelectric materials. Their usefulness may be attributed to the formation of minibands (arising from the longitudinal modulation) which restricts the energies of charge carriers to a narrow range of energies which optimize the Seebeck coefficient. The small lateral size of the wires and longitudinal modulations/interfaces inhibit the propagation of the quanta of lattice vibrations, thus lowering the thermal conduction and increasing ZT.

The nanowires and nanoribbons are fabricated using lithographic processing techniques, making it possible to control many properties of the nanowires, including alignment with respect to other nanowires or nanoribbons, composition, crystallographic orientation, doping (including conductivity type and concentration) characteristics, strain characteristics, dimensions (including aspect ratios), and connectivity to other nanowires and nanoribbons. These characteristics are difficult, if not impossible, to control using more conventional nanowire fabrication techniques, such as VLS. In addition, the use of lithographic techniques makes it possible to fabricate hundreds or thousands of identical nanowires or nanoribbons on a single substrate.

The ability to control nanowire and nanoribbon orientation can be particularly advantageous in some materials systems. Using lithography, the orientations of the lengths and the surfaces of the nanowires and nanoribbons can be chosen from among a very large number of parameters. In addition, where the nanowires and nanoribbons are formed from a silicon substrate, silicon starting materials and processing techniques which are widely used and readily available may be employed. For example, the substrate from which the nanowires and nanoribbons are fabricated (e.g., silicon-on-insulator; see discussion below) may be obtained with silicon template layers in all of the low-index crystallographic orientations, with (001) the most common and (110) and (111) for certain advanced electronic applications. Because the nanowire or nanoribbon patterns are produced lithographically, they can be oriented with any in-plane orientation relative to the wafer. Other methods of producing nanowires do not provide this degree of freedom and instead produce wires in which the orientations are severely limited. Most commonly, VLS-grown Si wires are oriented with their lengths along [111]. In addition to length orientations, surface orientations can be controlled by patterning the nanowires so that their edges fall near major axes. For example, it is straightforward experimentally to choose whether to have <110> sidewall facets on a <110>-oriented wire fabricated on an (001) substrate, or <001> facets on an <001>-oriented wire on an (001) substrate. The orientations can be modified further by annealing or anisotropic etching.

The lithographic techniques may be used to form nanowires or nanoribbons which are either fully or partially released from an underlying substrate, as described in greater detail below. For the purposes of this disclosure, a "nanowire" refers to a structure that has nanoscale dimensions (i.e., dimensions of 100 nm or less, preferably 50 nm or less, or even 10 nm or less) in two dimensions. A "nanoribbon" refers to a structure that may have nanoscale dimensions in only one dimension. The nanowires and nanoribbons are fabricated from semiconductor nanomembrane substrates. The semiconductor nanomembranes are thin sheets of one or more layers of single-crystal semiconductor material, each layer typically having a thickness of no more than about 100 nm each, desirably no more than about 50 nm, more desirably no more than about 30 nm, more desirably no more than about 10 nm, and still more desirably no more than about 5 nm.

The device layer of a semiconductor-on-insulator structure, such as silicon-on-insulator ("SOI"), germanium-on-insulator ("GOI"), or strained silicon-on-insulator ("sSOI") structures, may be used as the starting point for nanomembrane formation. In some embodiments, the membranes are composed of strained multi-layered semiconductor heterostructures, rather than a single semiconductor layer. In these membranes, strain is shared coherently between the layers. For example, the membranes may include a heterostructure of Si and SiGe wherein the Si layer is a strained layer, or a sandwich heterostructure of Si/Ge/Si. Such structures may be grown on an SOI wafer using standard epitaxial growth techniques. The use of an SOI wafer has the advantage that large numbers of nanowires and nanoribbons can be patterned in a single substrate, and these nanowires and nanoribbons are initially supported and aligned on an underlying sacrificial layer (i.e., the buried oxide layer of the SOI). As a result, arrays of nanowires and nanoribbons fabricated on the device layer of an SOI wafer may be easily transported, manipulated, and transferred. Another significant advantage of producing nanowires and nanoribbons from a semiconductor nanomembrane is that the semiconductor material may be processed prior to nanowire or nanoribbon patterning. Thus, the nanomembrane may be modified by doping, epitaxial growth, metallization, and/or contact formation before the nanowires and nanoribbons are lithographically defined. For example, the nanomembranes may be doped with small amounts of impurity atoms that scatter short-wavelength phonons and enhance electrical conduction prior to nanowire or nanoribbon formation. This effect can be achieved in a Si nanomembrane by doping with Ge atoms.

A general process for fabricating a plurality of nanowires in a semiconductor nanomembrane is shown schematically in FIG. 1. The substrate depicted in FIG. 1 is a SOI substrate 111 with a Si handle wafer 113. Commercially available SOI structures typically have a device (outer Si, 102) layer thickness of about 100 nm with a 200-nm-thick buried ($SiO_2$) oxide layer, 104. Thus, prior to nanowire formation, it may be desirable to thin the device layer to a desired thickness. For example, the device layer may be thinned in a two-step process whereby the device layer undergoes dry thermal oxidation at an elevated temperature, followed by an acid etch. Using this two-step process at a thermal oxidation temperature of about 1050° C. for 3.5 hours, a 100-nm-thick device layer of Si may be thinned to 20 nm. The device layer thickness may be further reduced using a second thermal oxidation at a lower temperature or wet oxidation and 10% hydrofluoric acid (HF) dip. Methods for thinning and releasing the top layer of SOI or similar material are described in Roberts, et al., *Nature Materials*, 5, 388 (2006).

Once a nanomembrane having the appropriate thickness is produced, a resist material 100 (e.g., PMMA) is patterned on the nanomembrane and developed to provide a nanowire pattern (e.g., using photolithography) in the resist. The exposed regions of the resist 105 and the underlying device layer are etched down to the sacrificial layer to define a plurality of parallel strips 106 separated by lateral channels 107. The etching can be done chemically or using reactive ion etching. For (001) SOI device layers, etching wires oriented along <011> directions would produce smooth (111)-faceted sidewalls. Reactive ion etching or isotropic chemical etches can be used to produce wires of arbitrary orientation, including those with orientations that cannot be grown by VLS or related techniques. Once the nanowires have been defined by etching into the SOI device layer, they can be fully or partially released by etching away the buried oxide layer 104 or kept in place and processed further. A partial release step may be important in insulating the wires for thermal devices so that the substrate does not form a thermal short circuit.

The nanowires may be defined by electron beam lithography or interferometric lithography using coherent radiation from laser, electron storage ring, or other ultraviolet light source. In interference lithography, a precise interference pattern can be produced by recombining beams from a coherent light source. The period of the interference pattern is related to the angles at which the two beams intersect the surface. For example, where the two beams make the same angle $\theta$ with respect to the surface normal, the period of the interference pattern is $\lambda/2 \sin \theta$. Interference lithography in the EUV range of wavelengths typically uses $\lambda \approx 13$ nm, and convergence angles, $\theta$, in the range of 20° or more. Thus, periods of the pattern on the order of ten to a few tens of nanometers may be produced. Wires occupy approximately half of the repeat length. A number of interferometer arrangements can be used to produce the converging beams, including mirrors, gratings and crossed gratings, and arrays of points. A more detailed discussion of interference lithography may be found in X. L. Chen, S. H. Zaidi, S. R. J. Brueck, and D. J. Devine, "Interferometric lithography of sub-micrometer sparse hole arrays for field-emission display applications," *J. Vac. Sci. Technol.*, B 14, 3339 (1996); H. H. Solak, D. He, W. Li, S. Singh-Gasson, F. Cerrina, B. H. Sohn, X. M. Yang, and P. Nealey, "Exposure of 38 nm period grating patterns with extreme ultraviolet interferometric lithography," *Appl. Phys. Lett.* 75, 2328 (1999); H. H. Solak, C. David, J. Gobrecht, L. Wang, and F. Cerrina, "Multiple-beam interference lithography with electron beam written gratings," *J. Vac. Sci. Technol.*, B 20, 2844 (2002); D. H. Malueg, J. W. Taylor, D. Thielman, Q. Leonard, S. Dhuey, and F. Cerrina, "Modeling, fabrication, and experimental application of clear x-ray phase masks," *J. Vac. Sci. Technol.*, B 22, 3575 (2004); S. O. Kim, H. H. Solak, M. P. Stoykovich, N. J. Ferrier, J. J. de Pablo, and P. F. Nealey, "Epitaxial self-assembly of block copolymers on lithographically defined nanopatterned substrates," *Nature* 424, 411 (2003); F. Juillerat, H. H. Solak, P. Bowen, and H. Hofmann, "Fabrication of large-area ordered arrays of nanoparticles on patterned substrates," *Nano Lett.* 16, 1311 (2005); L. J. Heyderman, H. H. Solak, C. David, D. Atkinson, R. P. Cowburn, and F. Nolting, "Arrays of nanoscale magnetic dots: Fabrication by x-ray interference lithography and characterization," *Appl. Phys. Lett.* 85, 4989 (2004).

Once the nanowires are formed, they may be transferred to another substrate using an adhesive host substrate or "stamp." A description of an example of such transfer methods may be found in Yuan, et al., *J. Appl. Phys.*, 100, 012708 (2006), the entire disclosure of which is incorporated herein by reference. Alternatively, the nanowires or nanoribbons may be only partially released, remaining attached to the underlying substrate along an edge or at the nanowire ends. Large monolithic blocks of nanowires can be made this way on Si wafers The basic processing steps shown in FIG. 1 may be used to make a variety of semiconductor thermoelectric nanowires and nanoribbons, including compositional superlattice nanowires, nanowires having a plurality of junctions connected in series, and strain modulated nanoribbons. Each of these types of nanowires and nanoribbons is described in greater detail below.

Compositional Superlattice Nanowires

Figure 2:
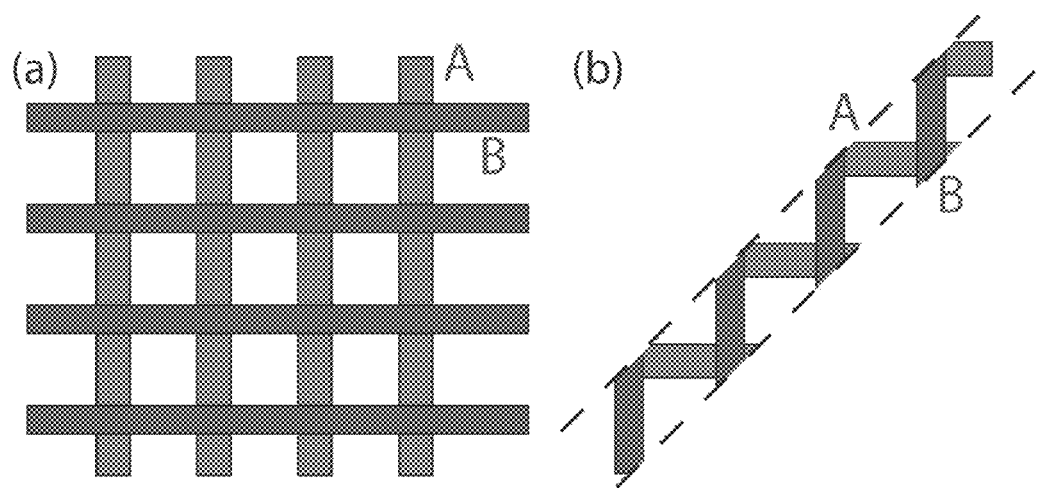
FIG. 2 illustrates a method of forming a thermoelectric nanowire from a nanowire mesh.

The basic scheme shown in FIG. 1 may be used in the production of compositional-superlattice nanowires. These are nanowires having a compositional modulation along their lengths. In the fabrication of these nanowires, the process depicted in FIG. 2 is carried out at least twice on a single substrate with at least one intervening deposition step. More specifically, the process shown in FIG. 1 is carried out on a nanomembrane of a first semiconductor material to provide strips of the first semiconductor material separated by lateral channels. A second semiconductor material is then deposited (e.g., epitaxially grown) into the channels to provide a new nanomembrane composed of strips of the first semiconductor material adjacent to and separated by strips of the second semiconductor material. For example, starting with a Si nanomembrane substrate, one may cut strips of Si (the first semiconductor material) into the substrate and subsequently grow a SiGe alloy (the second semiconductor material) in the channels.

The scheme shown in FIG. 1 is then repeated using this new nanomembrane as a substrate, wherein nanowires are patterned and etched into the nanomembrane at an angle not aligned with the longitudinal axes of the alternating strips. The result is a plurality of nanowires having a periodic composition of the first semiconductor material and the second semiconductor material along their lengths. Using this technique, thousands to millions of identical superlattice nanowires may be produced.

Importantly, the present compositional-superlattice nanowires are not limited to nanowires having only two alternating semiconductor materials along their lengths. Compositional superlattice nanowires having three, four, or even more alternating semiconductor materials along their lengths may be fabricated from a nanomembrane substrate comprising regularly or randomly alternating strips of three, four, or even more different semiconductor materials.

In the compositional-superlattice nanowires, the cross-sectional dimensions of the nanowires and the length of each compositional region making up the alternating compositional structure is sufficiently small to produce quantum confinement within the wire. As a result, the periodic compositional variation along the length of the nanowire creates a miniband/minigap structure within the bulk crystal bands. This miniband structure depends on both the semiconductor materials used to create the compositional variation and the dimensions of the compositional variation. The Seebeck coefficient of a material is theoretically maximized when the energies of charge carriers are confined to a particular energy with respect to the Fermi level. Therefore, minibands can be engineered to occur in a narrow range around this optimal energy, maximizing ZT. Typically, cross-sectional dimensions of the superlattice nanowires will be no greater than about 100 nm×100 nm. This includes embodiments wherein the cross-sectional dimensions are no greater than about 50 nm×50 nm, further includes embodiments wherein the cross-sectional dimensions are no greater than about 30 nm×30 nm, and still further includes embodiments wherein the cross-sectional dimensions are no greater than about 10 nm×10 nm. Typically, lengths for each compositional segment along the length of the nanowires will be no greater than about 500 nm, depending upon the nature of the composition. In some instances, the length of each segment will be no greater than about 100 nm, no greater than about 50 nm, or even no greater than about 20 nm.

Serial Junction Nanowires

The basic scheme depicted in FIG. 1 may also be used as the starting point for forming compositionally modulated nanowires comprising a plurality of junctions connected in series along their length. The junctions are defined by the interface of two compositionally different materials.

In the production of such nanowires, the process shown in FIG. 1 is carried out separately on two nanomembranes having different compositions to provide a first set of strips of a first semiconductor material (e.g., a first SiGe alloy composition) supported on a first substrate and a second set of strips of a second semiconductor material (e.g., a second SiGe alloy composition) supported on a second substrate. The second set of strips, which is still supported by its substrate, is then transferred and bonded over the first set using membrane transfer and bonding techniques, for example as described in Yuan, et al., *Appl. Phys. Lett.*, 89, 212105 (2006). As illustrated in FIG. 2(*a*), the second set of strips 202 is desirably bonded over the first set 204 at an orientation that provides an angle of less than 180° and greater than 0° between the longitudinal axes of the strips of the first semiconductor material and the longitudinal axes of the strips of the second semiconductor material so that the wires are crossed. For example, the angle between the longitudinal axes of the strips in the first set and those in the second set may be about 10° to 170°, about 45° to 135°, or about 90° (e.g., 90°±5°). The bonded, crossed arrays of strips provide a mesh structure having an array of junctions 206 formed at the areas of overlap between the strips of the first semiconductor material and the strips of the second semiconductor material. Slicing through rows of junctions 208, as shown in FIG. 2(*b*), provides a compositionally modulated nanowire having a zigzag structure with junctions 208 formed at the overlapping nanowire segment ends and connected in series by the central sections 210 of the nanowire segments. As shown in FIG. 2, the mesh is desirably sliced diagonally through the junctions. Thus, the slices may be taken at an angle that bisects the angles between the strips of the first semiconductor material and the strips of the second semiconductor material.

Using the present methods, a plurality of the structures shown in FIG. 2(*b*) may be defined from a single grid. The result is a linear array of aligned nanowires. The fabrication process can independently tune the relative crystallographic orientations of the nanowire segments, the orientation of the planes defining their interfaces, and the orientation of the overall superlattice structure. In addition, the crystalline quality of the interface between the two nanowire segments depends on the bonding process. Thermoelectric materials are majority carrier devices. Thus, the presence of a small excess of electronic defect levels at these interfaces, in comparison with what would be achieved by epitaxial growth, will have a minimal effect on thermoelectric performance.

The dimensions of the serial-junction nanowires may be similar to those of the compositional-superlattice nanowires. Thus, typically, cross-sectional dimensions of the serial-junction nanowires will be no greater than about 100 nm. This includes embodiments where the cross-sectional dimensions are no greater than about 50 nm, further includes embodiments where the cross-sectional dimensions are no greater than about 30 nm, and still further includes embodiments wherein the cross-sectional dimensions are no greater than about 10 nm.

Strain Superlattice Nanoribbons

Using strain rather than composition to provide a periodic longitudinal modulation of the properties of a nanoribbon provides an alternative to compositional modulation and takes advantage of the mechanical compliance of nanometer-scale crystals. A strain-induced superlattice can be realized by forming nanoribbons according to the scheme shown in FIG. 1, and at least partially releasing the nanoribbons from the underlying substrate. For example, the nanoribbons may remain attached to the substrate at their ends such that the "released" part of the nanoribbon forms a bridge between the attached ends. Quantum dots are then grown on opposing surfaces of the nanoribbons.

The strain superlattice design utilizes quantum dots made from a material having a lattice mismatch with the nanoribbon that is sufficiently large to induce a strain at the quantum dot/nanowire interface. For example, on an ultrathin silicon nanoribbon, germanium quantum dots can produce strains of up to one percent and large strain gradients. This strain results in the self-assembly of the quantum dots grown on opposing surfaces of the nanoribbon into anticorrelated positions and the creation of a periodic variation in the bandgap of the Si ribbon and therefore also a miniband structure. As used herein, the term "anticorrelated" indicates that the quantum dots on opposing surfaces of the nanoribbon are positionally staggered along the length of the nanoribbon, rather than positioned directly opposing one another. The miniband structure depends on both the semiconductor materials used to create the strain variation and the dimensions and spacing of the quantum dots on the nanoribbon. Therefore, the miniband can be engineered to occur around the optimum energy (with respect to the Fermi level) that maximizes the Seebeck coefficient. The nanoribbons desirably have a thickness of less than about 50 nm, more desirably less than about 20 nm, and still more desirably less than about 10 nm. The width of the nanoribbons should be in a range that allows the growth of a plurality of quantum dots on opposing surfaces in one row. In some embodiments, however, multiple rows of quantum dots may be grown on each surface. Thus, the nanoribbons may have a width of at least 50 nm, at least 100 nm, at least 200 nm, or at least 500 nm. Typically, the base dimension of the quantum dots will be between about 10 nm and about 100 nm, and the pitch (distance between the centers) of quantum dots in a row of quantum dots on the surface (one side) of the nanoribbon will be between about the base dimension of the quantum dot nm and several times this base dimension. The lengths of the nanoribbons (or the nanowires) may vary over a large range, but are generally at least about 0.5 µm. This includes embodiments where the nanoribbons (or nanowires) are at least about 1 µm long, at least about 5 µm long, and at least about 10 µm long.

Figure 3:
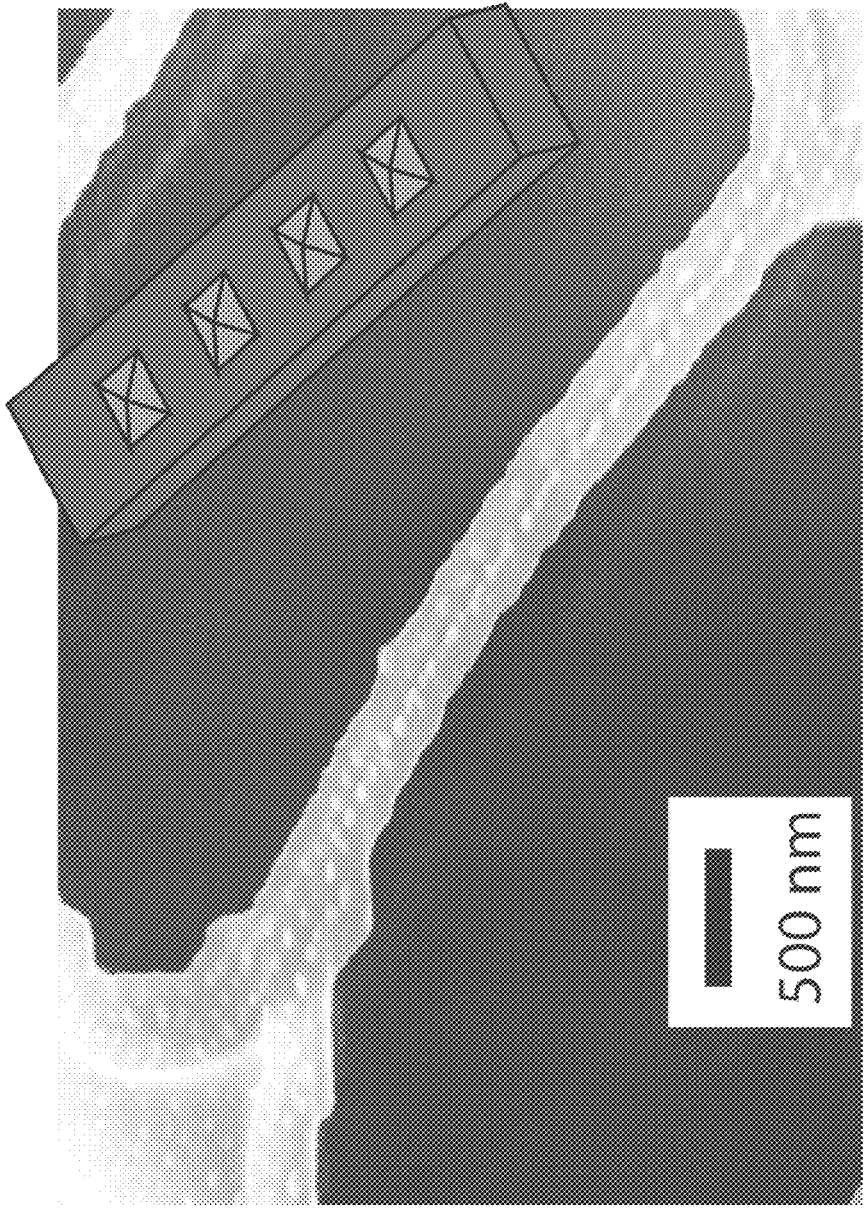
FIG. 3 is an image of a single Si nanoribbon with Ge quantum dots grown on both sides. The period between quantum dots is about 80 nm.

In some embodiments, the nanowires are Si nanoribbons and the quantum dots are Ge nanocrystals. Ge quantum dots grown on a silicon-on-insulator substrate can induce a significant strain in the Si (F. Liu, et al., *Nature*, 416, 498 (2001)) and this strain modifies the Si band structure (P. Sutter, et al., *Surface Sci.*, 789, 532 (2003)). A strain modulated Si nanoribbon formed by the growth of Ge quantum dots on opposing surfaces of an Si nanoribbon is shown schematically in FIG. 3. The nanoribbon was fabricated as follows. Partially released (i.e., ends remain attached), free-standing, 25-nm-thick Si nanoribbons were created by underetching silicon-on-insulator (SOI) after chemical cleaning and photolithographic patterning, as described in M. Roberts, et al., *Nature Materials*, 5, 388 (2006) and Boland, et al., *Nature*, 439, 671 (2006). Ge 'hut' quantum dots having a typical base dimension of ~80 nm (8 nm high) were grown by chemical vapor deposition in an ultra-high vacuum chamber, using $GeH_4$ in an H carrier gas. The self-organized ordering of these (relatively large) quantum dots is shown in FIG. 3 (and schematically in the inset of FIG. 3.)

Figure 4:
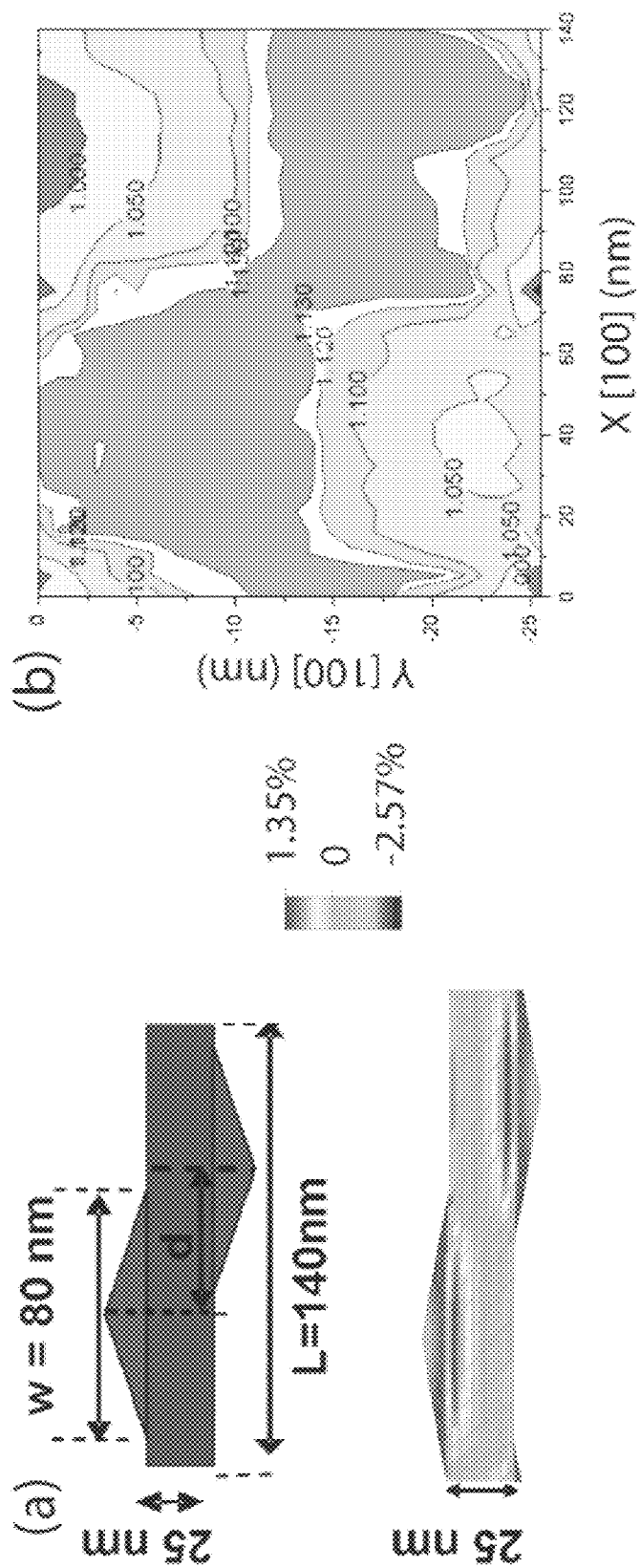
FIG. 4(a), upper panel, shows the anticorrelation in position of Ge quantum dots grown on the top and bottom surfaces of a Si nanoribbon.
FIG. 4(b) shows a calculation of a map of the bandgap (in eV) in a cross-section of a silicon membrane strained above (top right) and below (bottom left) by anticorrelated epitaxially grown quantum dots.

Growth of Ge quantum dots on one side of a membrane affects the position and ordering of the Ge quantum dots on the opposing side. In scanning electron microscopy (SEM), objects or morphologies that are illuminated with grazing incidence appear brighter because more secondary electrons escape to the detector. Thus, a particular shape, like that of the quantum dots, produces a different light/dark contrast if it is pointing upward (top surface) or downward (bottom surface). Using SEM, an anticorrelation in position was observed for the quantum dots on the upper surface of the nanoribbon relative to the quantum dots on the lower surface of the nanoribbon, with a mean separation, center to center, of 140 nm. This anticorrelation in position is shown schematically in FIG. 4(*a*), upper panel, and reflects a strong repulsive interaction, due to the nucleation of the quantum dots, across the thickness of the nanoribbon, creating a cooperative, anticorrelated self-assembly of quantum dots on the top and bottom surfaces of the Si nanoribbon. FIG. 4(*a*), lower panel, shows a simulation of the strain distribution of two quantum dots at the minimum-energy (anticorrelated) configuration on a 25-nm-thick silicon nanoribbon. The anticorrelated configuration allows optimum strain relaxation and residual stress reduction in both the Ge quantum dots and the Si nanoribbon.

FIG. 4(*b*) shows a calculation of a contour map of the bandgap (in eV) in a cross-section of a silicon membrane tensilely strained above (top right) and below (bottom left) by anticorrelated epitaxially grown Ge quantum dots. This figure shows the bandgap narrowing resulting from the strain imparted by Ge nanostressors on a 25-nm-thick Si membrane.

The resulting modification of the silicon bandstructure is significant, with wells up to ~150 meV deep, depending on the nanoribbon thickness and the size and composition of the stressor quantum dots. To a close approximation, the bulk silicon bandgap is maintained in the silicon between these quantum-dot-induced wells.

In another embodiment, the "nanoribbon" substrate on which the quantum dots are grown may be a compositional superlattice nanowire or a serial junction nanowire of the types described herein. In such an embodiment, the nanoribbon will have both a periodic compositional modulation and a periodic strain modulation along its length.

Applications

Figure 6:
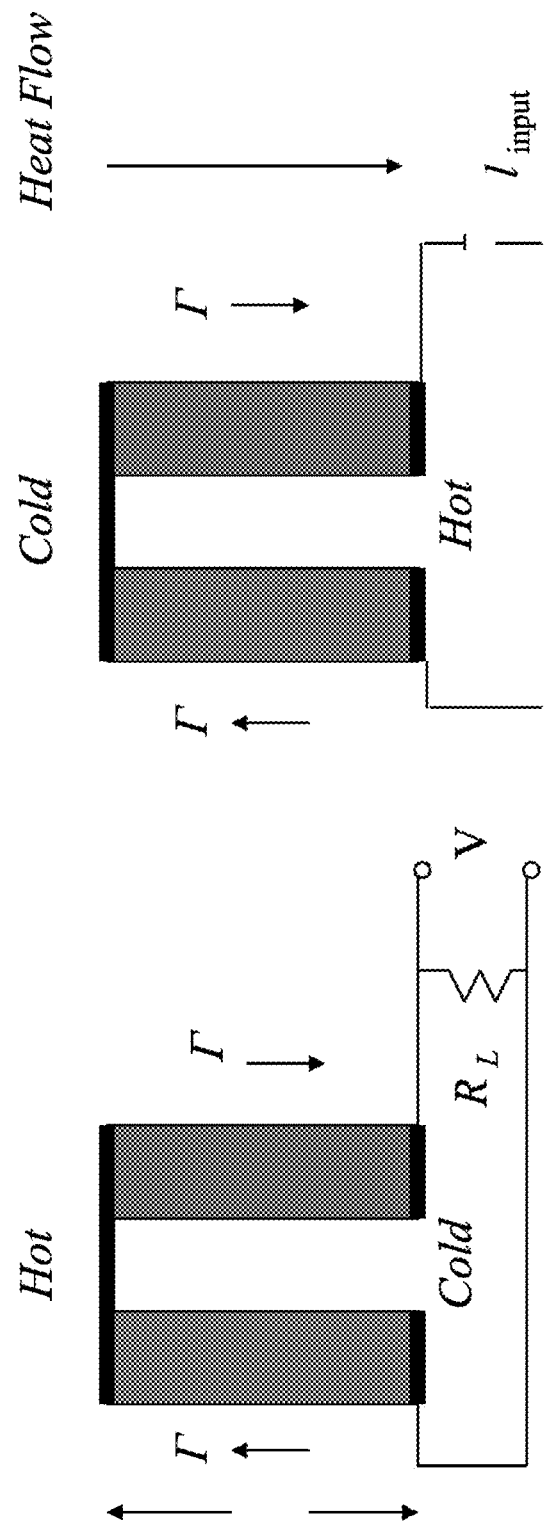
FIG. 6 is a schematic diagram of a basic thermoelectronic device.

Thermoelectric devices have one hot junction and one cold junction. In power generation from heat (e.g., thermal solar energy generation), the thermoelectric effect causes a current to flow, which generates a voltage across a resistor. In a heat pump (TE cooler) a battery drives a current through the junctions, removing heat from one. In the simplest manifestation, the right block shown in FIG. 6 could be a wafer or part of a wafer of p-doped Si patterned into nanowires still attached at their ends. Similarly, the left block could be a similarly patterned wafer that is n-doped. This process could be done monolithically, so that the p and n wire blocks remain in contact at one end but are separate at the other for connection to a battery or a resistive load. Alternatively the blocks can be separately fabricated and assembled in desired configurations of pn junctions at the hot end. A large number of blocks can be wired in parallel for greater power generation or cooling. The latter can, for example, be achieved by stacking and bonding a number of membranes.

All of the described modulated nanowires (compositional superlattice nanowires, nanowires having a plurality of junctions connected in series, and strain modulated nanoribbons) can be made in such blocks and connected in the manners above, in addition to simple blocks of wires of p and n doped Si or other suitable semiconductors. Nanowire arrays of all of these manifestations can also be transferred to other substrates that maybe prefabricated for specific needs (cooling, solar collection, etc.).

Figure 5:
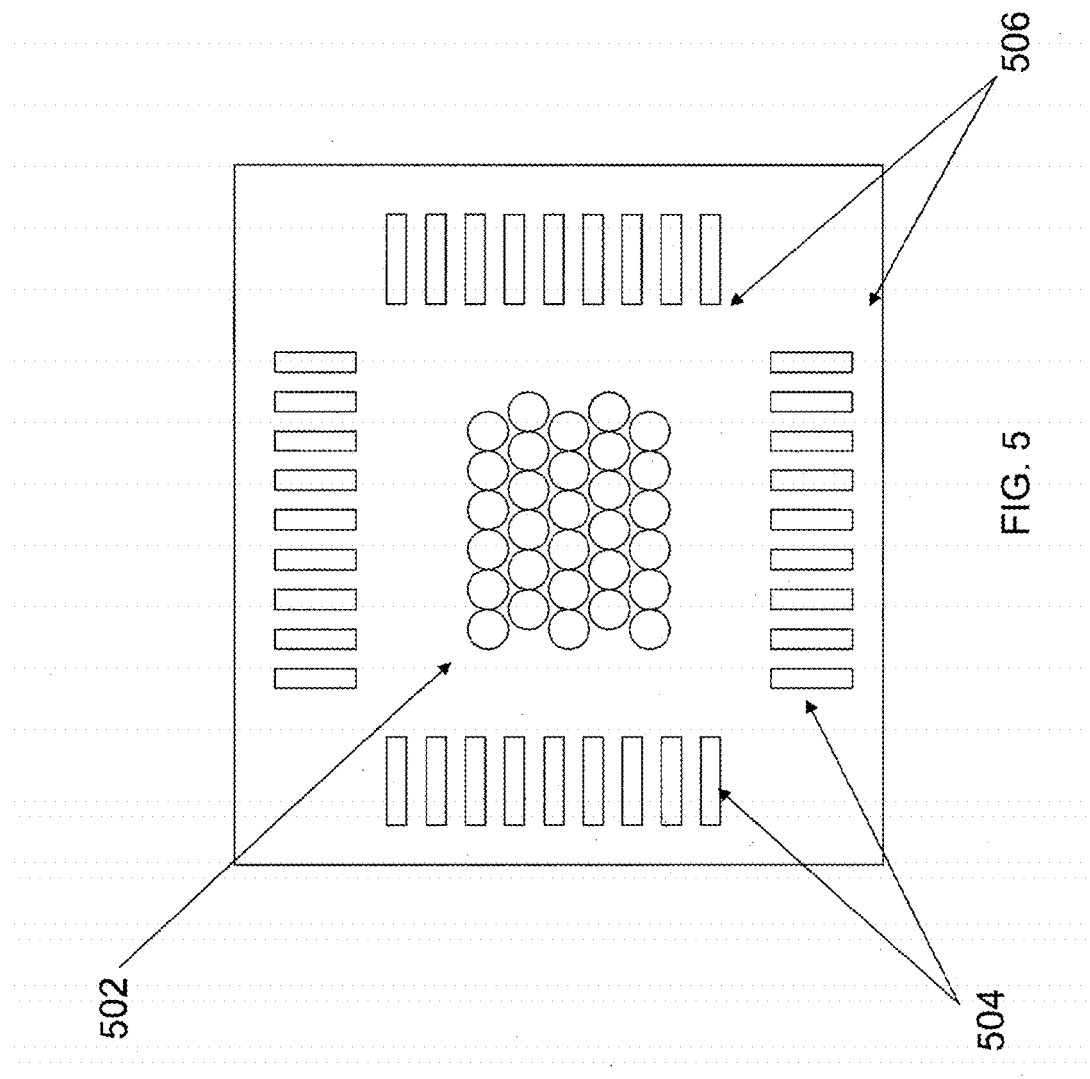
FIG. 5 is a schematic diagram of a TE cooler made of nanowires that may be used to transfer heat away from a local hot spot, for example in semiconductor integrated-circuits, infrared detectors, or micromechanical devices.

The present nanowires, if arrayed into a TE cell, are useful for a variety of thermoelectric applications. One such application is active local-area cooling. Local hot spots are a significant issue in microelectronics. It is predicted that speeds of semiconductor devices could increase up to 200% if local hot spots on processors could be relieved. Thus, the present nanowire and nanoribbon-based thermoelectrics may be used to lower the temperature of hot spots in microelectronic chips to near the average chip temperature by distributing the heat into a much larger area that can act as a heat sink, while only marginally raising the average temperature. FIG. 5 shows such a thermo-electric cooler schematically. This cooler includes an active region 502 surrounded by nanowire arrays 504 in contact with electrodes 506. In addition, the temperature of some critical component on a chip could be lowered below the ambient level, by causing the component to come into contact with the present nanowire thermoelectric materials. For example, one particular transistor, a light source, or a detector could have much improved performance (lower noise, higher sensitivity, higher speed, new functionality) by operating below the ambient temperature.

The present nanowire and nanoribbon thermoelectric materials are also well-suited for use as integrated power sources in nanodevices. If the modest power requirements of micro- and nanosensors and other nano-electronic or photonic devices can be provided by sources other than batteries, the lifetime and scope of applications of these devices can be greatly extended. Strategies for obtaining power for such devices include thermoelectric devices powered from ambient, chemical, or radioactive sources. Solar thermoelectric devices are promising in specialty applications. For example, in satellites the present thermoelectric nanowires can generate electrical power using solar heat from the sun-oriented side or using the heat generated by radioactive isotopes. This power may be used to supply current to thermoelectric coolers in dark areas of a spacecraft to reject heat from the vehicle, thus decreasing the amount of power required by the spacecraft to expel heat. Power requirements and the efficiency of the thermoelectric generators combine to dictate the size of the solar collector: the more modest the power requirement, the more compact the thermoelectric device can be. Thermoelectric devices are currently not competitive with other forms of large-scale solar energy conversion (e.g., photovoltaics) because the low efficiency of thermoelectric materials (low ZT) increases material and real-estate costs. However, the improved ZT of the present materials overcomes this limitation and makes these materials competitive in efficiency with photovoltaics.

Infrared (IR) detectors are another application for which the present thermoelectric nanowires are well suited. Thermoelectric IR sensors are well known and include a thermally insulated absorbing area which will convert the incident radiation into heat. The resulting temperature increase can be detected by sensing the temperature difference between the hot junctions on the absorbing area and the cold junctions. The thermoelectric approach to IR detectors differs from the CMOS imager approach. The current versions of thermoelectric IR imagers could be improved by employing the present thermoelectric materials for the same reasons that coolers and generators could be: improvement in ZT brought about by properly fabricated nanostructures. In addition, with higher ZT, pixel sizes could be reduced, providing the higher resolution needed for various spectroscopic and thermographic applications. The local cooling provided by devices incorporating thermoelectric nanowires can also be used to improve the figure of merit of IR detectors based on semiconductor photodiodes or pyroelectric materials.

As used herein, and unless otherwise specified, "a" or "an" means "one or more." All patents, applications, references, and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

It is understood that the invention is not confined to the particular embodiments set forth herein as illustrative, but embraces all such forms thereof as come within the scope of the following claims.

What is claimed is:

1. A method of making at least one nanowire comprising a plurality of quantum dots along its length, the method comprising forming a first set of strips comprising a first semiconductor material separated by lateral channels, growing a second semiconductor material in the lateral channels to provide a nanomembrane comprising alternating strips of the first and second semiconductor materials, and cutting at least one nanowire out of the nanomembrane, wherein the longitudinal axis of the at least one nanowire is not aligned with the longitudinal axes of the strips of first and second semiconductor materials, the at least one nanowire comprising quantum dots comprising the first and second semiconductor materials along its length.

2. The method of claim 1, wherein the longitudinal axis of the at least one nanowire is perpendicular to, or substantially perpendicular to, the longitudinal axes of the strips of first and second semiconductor materials.

3. The method of claim 1, wherein the first semiconductor material is Si and the second semiconductor material is a SiGe alloy.

4. The method of claim 1, wherein the first semiconductor material is Si(001).

5. The method of claim 4, wherein the at least one nanowire is are oriented along the <011> direction of the Si.

6. The method of claim 4, wherein the at least one nanowire is are oriented along the <110> direction of the Si.

7. The method of claim 4, wherein the at least one nanowire is are oriented along the <001> direction of the Si.

8. The method of claim 1, wherein the first semiconductor material is Si(110).

9. The method of claim 1, wherein the first semiconductor material is Si(111).

10. The method of claim 1, wherein the crystallographic orientation of the semiconductor materials are orientations that cannot be grown using vapor-liquid-solid growth.

11. The method of claim 1, further comprising growing a third semiconductor material in the lateral channels to provide a nanomembrane comprising alternating strips of the first, second and third semiconductor materials, wherein the at least one nanowire comprises quantum dots comprising the first, second and third semiconductor materials along its length.

12. The method of claim 1, wherein thousands of nanowires are cut out of the nanomembrane.

13. The method of claim 1, wherein millions of nanowires are cut out of the nanomembrane.

14. The method of claim 1, wherein the first and second semiconductor materials comprise alloys of the same material, but have different compositional ratios.

15. The method of claim 1, wherein the nanomembrane comprising alternating strips of the first and second semiconductor material is formed on a layer of sacrificial material.

16. The method of claim 15 further comprising releasing the at least one nanowire from the layer of sacrificial material.

17. The method of claim 15, wherein the first semiconductor material comprises the device layer of a semiconductor-on-insulator substrate and the layer of sacrificial material is a buried oxide layer of the semiconductor-on-insulator substrate.

18. The method of claim 17, wherein the first semiconductor material comprises the silicon device layer of a silicon-on-insulator substrate.

19. The method of claim 17, wherein the first semiconductor material comprises the germanium device layer of a germanium-on-insulator substrate.

20. The method of claim 17, wherein the first semiconductor material comprises the strained semiconductor device layer of a strained-semiconductor-on-insulator substrate.

* * * * *

UNITED STATES PATENT AND TRADEMARK OFFICE
CERTIFICATE OF CORRECTION

PATENT NO. : 9,181,092 B2
APPLICATION NO. : 13/945171
DATED : November 10, 2015
INVENTOR(S) : Max G. Lagally et al.

It is certified that error appears in the above-identified patent and that said Letters Patent is hereby corrected as shown below:

IN THE SPECIFICATION:

Column 5, lines 49 and 50:

Delete "silicon-on-insulator ("SOT"), germanium-on-insulator ("GOT")" and replace with -- silicon-on-insulator ("SOI"), germanium-on-insulator ("GOI") --

Column 5, line 59:

Delete "grown on an SOT wafer" and replace with -- grown on an SOI wafer --

Column 5, line 60:

Delete "the use of an SOT wafer" and replace with -- the use of an SOI wafer --

Column 5, line 64:

Delete "buried oxide layer of the SOT" and replace with -- buried oxide layer of the SOI --

Column 5, line 66:

Delete "layer of an SOT wafer" and replace with -- layer of an SOI wafer --

Signed and Sealed this
Ninth Day of August, 2016

Michelle K. Lee
*Director of the United States Patent and Trademark Office*